United States Patent [19] [11] Patent Number: 4,613,736
Shichijo et al. [45] Date of Patent: Sep. 23, 1986

[54] OPERATING PANEL

[75] Inventors: Hajime Shichijo, Fujisawa; Masamitsu Tsukatani, Chigasaki; Takeshi Kato, Sakura, all of Japan

[73] Assignee: Sony Corporation, Tokyo, Japan

[21] Appl. No.: 677,904

[22] Filed: Dec. 6, 1984

Related U.S. Application Data

[63] Continuation of Ser. No. 358,662, Mar. 16, 1982, abandoned.

[30] Foreign Application Priority Data

Mar. 20, 1981 [JP] Japan .............................. 56-39986[U]

[51] Int. Cl.⁴ .............................................. H01H 9/16
[52] U.S. Cl. .................................. 200/317; 200/5 A; 200/340
[58] Field of Search .................... 200/159 B, 314, 5 A, 200/317

[56] References Cited

U.S. PATENT DOCUMENTS 3,627,935 12/1971 Spievak ............................ 200/340 X
4,032,729 6/1977 Koistinen ......................... 200/340 X
4,136,270 1/1979 Wernet et al. ....................... 200/5 A
4,190,748 2/1980 Langford ......................... 200/159 B
4,338,502 7/1982 Hashimoto et al. ............. 200/340 X
4,387,282 6/1983 Latasiewicz .................... 200/159 B

FOREIGN PATENT DOCUMENTS 2459464 6/1975 Fed. Rep. of Germany ... 200/159 B
1496640 12/1977 United Kingdom ................ 200/317
2084802 4/1982 United Kingdom ............... 200/5 A Primary Examiner—Stephen Marcus
Assistant Examiner—Rence S. Luebke
Attorney, Agent, or Firm—Hill, Van Santen, Steadman & Simpson

[57] ABSTRACT

An operating switch panel, such as for an audio equipment tuner, utilizes a metal plate which is divided into a plurality of operating parts by simultaneous etching from both sides. Connecting parts remain between individual operating parts. Thin hinges are formed on the operating parts by etching from the back surface of the metal plate, dividing each operating part into two stationary and movable parts. The stationary parts are connected to each other through the connecting parts. Display parts in the form of recesses are formed on the surface of the metal plate respectively at each operating part. Projections are formed on the back surfaces of the movable parts for engaging associated switches. A number of operating parts can be arranged close to each other in a simplified and economical manufacturing process.

7 Claims, 9 Drawing Figures

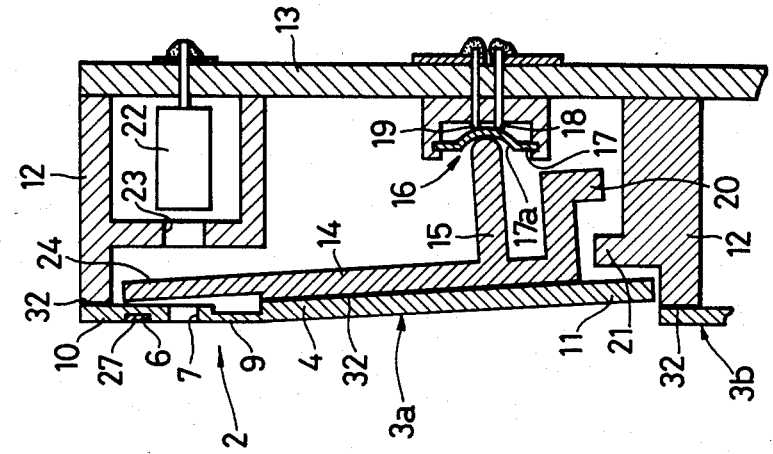
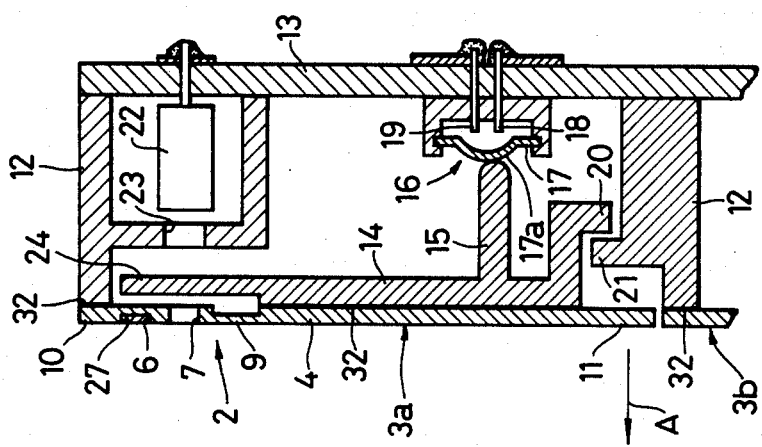

OPERATING PANEL

This is a continuation of application Ser. No. 358,662, filed Mar. 16, 1982, now abandoned.

BACKGROUND OF THE INVENTION

The present invention relates to an operating panel which is conveniently used for a switch station in electronic equipment such as an audio equipment tuner or amplifier.

Many switches are arranged on an operating panel which is mounted on the front panel of a metal casing of a tuner, an amplifier or the like. With a recent demand for smaller audio equipment or the like, it is required to arrange these switches as close as possible. However, conventional operating panels are of a construction in which each switch has its own operating member, so that it is difficult to arrange these switches close to each other. In equipment of this type, the front panel and the operating panel are generally made of metal plates for the purpose of attaining luxurious appearance and better mechanical strength. Typically, the operating parts of the switches mounted on the operating panel are made of synethetic resin, such that these operating parts must be plated with a metal so as to avoid poor appearance. This results in higher manufacturing cost.

It is an object of the present invention to provide an operating panel in which a number of operating parts can be arranged close to each other without rendering the manufacturing process complex and the manufacturing cost higher.

It is another object of the present invention to provide an operating panel which has a luxurious appearance.

The above, and other objects, features and advantages of the invention, will be apparent in the following detailed description of illustrative embodiments of the invention.

SUMMARY OF THE INVENTION

An operating panel is formed by a metal plate which is divided into a plurality of operating switch parts by simultaneous etching from front and back surfaces thereof with connecting parts remaining between the operating parts. Thin wall hinges are respectively formed on the operating parts by etching from the back surface of the metal plate. The hinges each divide one operating part of the plate into two stationary and movable parts, the stationary parts being connected to each other through the connecting parts. A respective display part constituting a recess is formed on each operating part by etching from the front surface of the metal plate. Projections are formed on back surfaces of the movable parts for selectively engaging with push switches for controlling a circuit board connected to the operating panel frame.

BRIEF DESCRIPTION OF THE DRAWING

FIG. 3 is a sectional view along the line III—III of FIG. 2;

FIG. 4 is a sectional view similar to FIG. 3 showing the movable parts in the pressed condition;

DESCRIPTION OF THE PREFERRED EMBODIMENTS

The present invention will now be described with reference to a tuner embodiment.

Figure 1:
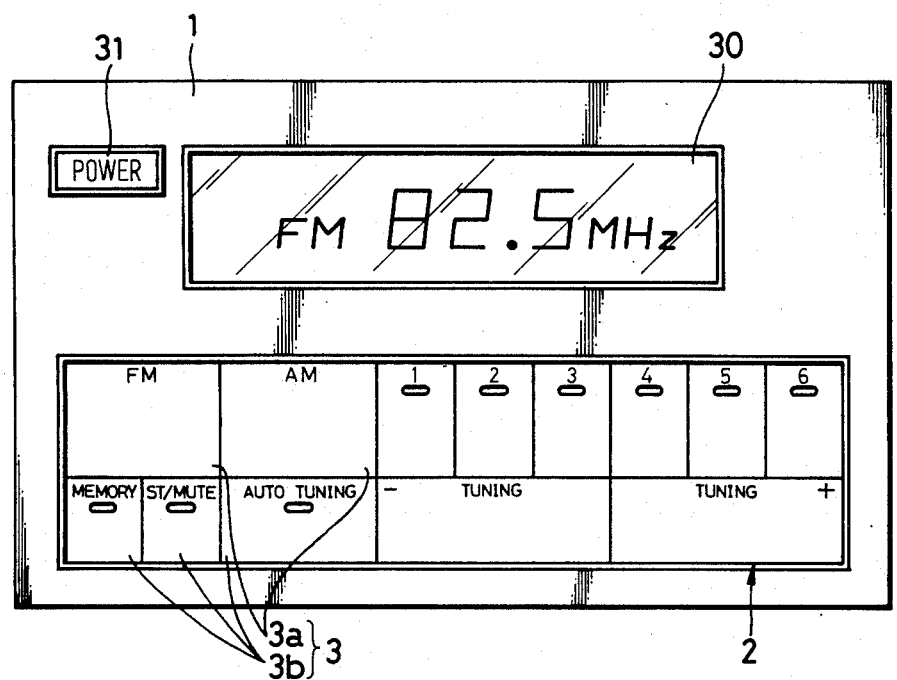
FIG. 1 is a front view of a tuner having an operating panel according to an embodiment of the present invention.
Figure 2:
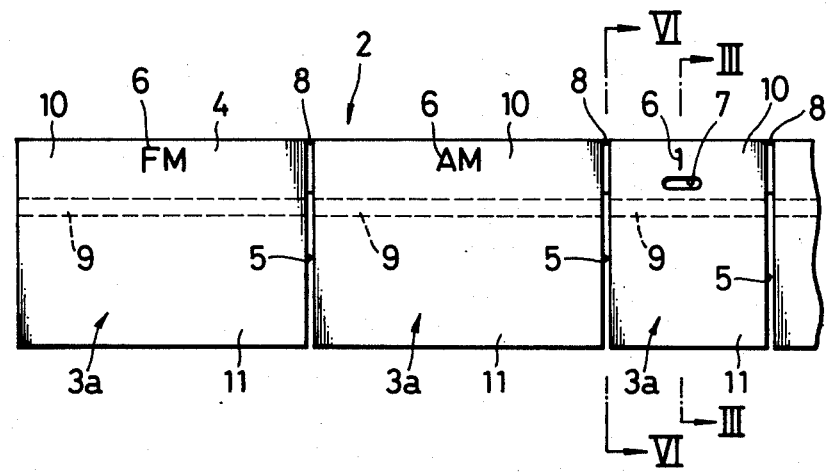
FIG. 2 is a partial, enlarged front view of the operating panel of FIG. 1.

FIG. 1 shows a metal front panel 1 of the tuner having openings arranged for a tuning frequency digital display 30, a power switch 31, and an operating panel 2. In the operating panel 2 is arranged an operating part 3 consisting of two transversely arranged switch operating parts 3a and 3b. These switch operating parts 3a and 3b are respectively formed by unitary stainless steel plates 4. The switch operating parts 3a are divided by transverse slits 5 as shown in FIG. 2. The slits 5 extend through the entire thickness of the stainless steel plate 4. Connecting parts 8 of relatively small thickness for connecting the operating parts 3a are arranged in the slits 5. The front surface of each operating part 3a and 3b is etched with a display part 6 of characters, numbers, symbol or the like such as "FM" and "AM", and may also be formed with a through hole 7.

As shown in FIGS. 3 and 4, at the back surface of each operating part 3a of the stainless steel plate 4 is arranged a hinge 9 which extends along the longitudinal direction of the stainless steel plate 4. This hinge 9 is formed in the shape of a recess at the back surface of the stainless steel plate 4 by etching. The hinge 9 separates each operating part 3a into an upper stationary part 10 and a lower movable part 11. The stationary parts 10 of the respective operating parts 3a are connected to each other through the connecting parts 8. The display part 6 and the through hole 7 are formed at the stationary part 10 of a predetermined operating part 3a. The movable part 11 is coupled to the stationary part through the hinge 9. The movable parts 11 of the respective operating parts 3a are completely separated from each other with slits 5 for relative movement with respect to each other.

The stainless steel plate 4 is adhered through an adhesive 32, such as an ABS resin or the like, to a frame 12. A printed circuit board 13 is fixed to the other side of the frame 12. To the back surface of the movable part 11 of the stainless steel plate 4 is adhered through adhesive 32 a transparent or semi-transparent operating member 14 of a styrol resin or the like. A projection 15 extends integrally from the back surface of the operating member 14. A push switch 16 is mounted to an associated part of the printed circuit board 13 corresponding to the projection 15. The push switch 16 has a metal plate 17 at its front side. The metal plate 17 has a central bulged part 17a which extends outward toward the projection 15.

When the movable part 11 of the stainless steel plate 4 is pressed by a finger or the like, the operating part 3a of the stainless steel plate 4 bends at the hinge 9 and the movable part 11 pivots as shown in FIG. 4. Then, the projection 15 of the operating member 14 fixed to this movable part 11 urges the central bulged part 17a of the metal plate 17 inwardly. Due to the elasticity of the central bulged part 17a, it projects inward as shown in FIG. 4 to contact a pair of terminals 18 and 19, thus connecting these terminals 18 and 19. In this manner, the switch 16 is turned on.

When the finger or the like is released from the stainless steel plate 4, the central bulged part 17a of the metal plate 17 returns to the state as shown in FIG. 3 by its elastic recovering force. The movable part 11 of the stainless steel plate 4 returns to the state shown in FIG. 3 since the projection 15 of the operating member 14 is urged by the central bulged part 17a of the metal plate 17 and/or since the hinge 9 of the stainless steel plate 4 elastically recovers.

An engaging part 20 having an L-shaped sectional shape is integrally formed with the operating member 14 which is fixed to the movable part 11 of the stainless steel plate 4. An engaging part 21 is formed in the frame 12 in correspondence with the engaging part 20 of the operating member 14. When the movable part 11 returns, the engaging part 20 of the operating member 14 contacts the engaging part 21. Thus, the movable part 11 of the stainless steel plate 4 may not excessively protrude outward (in the direction indicated by arrow A in FIG. 3), and the appearance of the operating panel 2 is that of a substantially smooth or flush surface.

A light-emitting element 22 such as an LED is mounted to the printed circuit board 13 in correspondence with the through hole 7 formed in the stainless steel plate 4. This light-emitting element 22 is made to light up when the push switch 16 is on. Light from the light-emitting element 22 illuminates the through hole 7 through another through hole 23 formed in the frame 12. The operating member 14 contains a light dispersing plate portion 24 which is interposed between the through hole 7 and the through hole 23 of the frame 12. This light dispersing plate portion 24 serves to guide the light emitted by the light-emitting element 22 to the through hole 7 after dispersing it.

The above description has been made with a particular reference to a case wherein the operating parts 3a of a number of switches arranged in a row are made from one stainless steel plate 4. The other operating parts 3b are of the similar configuration so that these operating parts 3a and 3b may be formed close to each other. Thus, the overall operating panel 2 may be made relatively compact in size. Since the operating parts 3a or 3b and the printed circuit board 13 may be mounted on the frame 12 in a unitary form, the unit thus obtained may be easily mounted in the opening formed in the front panel 1. Furthermore, the respective operating parts 3a and 3b or both, that is, the overall operating panel 2, is made of stainless steel, so that the operating panel 2 may match the metal of the front panel 1 for a pleasing appearance to the overall equipment.

The step for forming the operating parts 3a or 3b in the stainless steel plate 4 may be performed simultaneously with the step for forming the through hole 7 and the display part 6 in the stainless steel plate 4. The operating panel is thus extremely advantageous in terms of manufacturing cost as compared with an operating panel with operating parts of synthetic resin which require plating with a metal.

A method for forming the operating parts 3a in the stainless steel plate 4 will now be described with reference to FIGS. 5A to 5D and 6.

Figure 5A:
FIGS. 5A to 5D are sectional views showing in sequential order the method for etching a stainless steel plate.
Figure 5B:
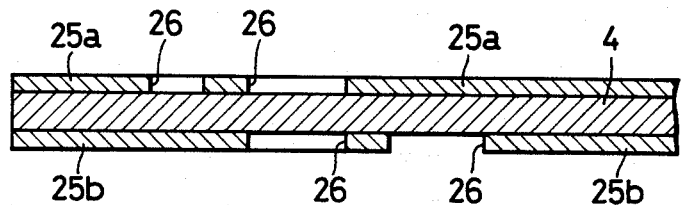
Figure 6:
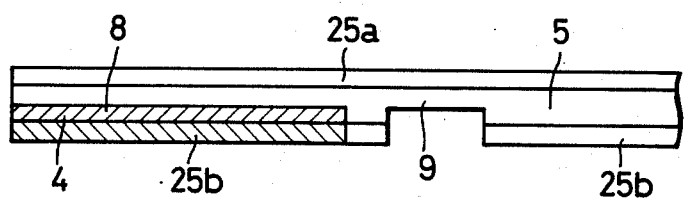
FIG. 6 is a sectional view of the part corresponding to the line VI—VI in FIG. 2 in the condition as shown in FIG. 5C.

First as shown in FIG. 5A, a stainless steel plate 4 of about 0.012 to 0.4 mm thickness is prepared. Then, as shown in FIG. 5B, etching masks 25a and 25b of predetermined patterns are deposited over the front and back surfaces of the stainless steel plate 4. Openings 26 are formed at the parts of these etching masks 25a and 25b which must be etched through the thickness thereof in correspondence with the slits 5 and the through holes 7. Other openings 26 are formed only in parts of the etching mask 25a on the front surface of the stainless steel plate 4 which correspond to the recessed portions on the front surface of the stainless steel 4 such as the display parts 6 and the connecting parts 8. Still other openings 26 are formed in the part of the etching mask 25b on the back surface of the stainless steel plate 4 corresponding to the recess or hinge parts 9 to be formed in the back surface of the stainless steel plate 4. The connecting parts 8 are formed by etch openings in the masks 25a and 25b as shown in FIG. 6.

Figure 5C:
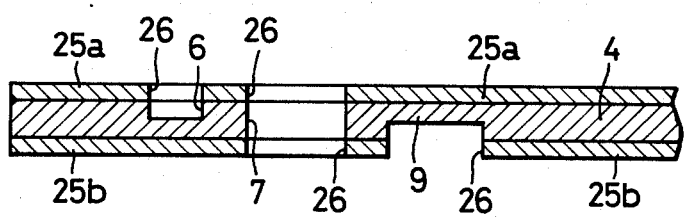

The stainless steel plate 4 is immersed in the etching solution to etch it through the openings 26 formed in the etching masks 25a and 25b as shown in FIG. 5C. The etching time is adjusted so that the display parts 6 and the hinges 9 as shown in FIG. 5C and the connecting parts 8 as shown in FIG. 6 are etched to a depth about half or slightly more of the thickness of the stainless steel plate 4. At the parts where the openings 26 are formed on both surfaces, the stainless steel plate 4 is etched from both surfaces and etched through its thickness. On the other hand, at the parts where the opening is formed only in one surface, the stainless steel plate 4 is etched only from one surface and a recess is formed. At this time, the thickness of the display part 6, the connecting part 8 and the hinge 9 becomes the same since the etching conditions are the same.

Figure 5D:
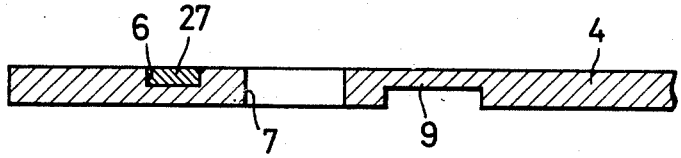

In the next step, as shown in FIG. 5D, the etching masks 25a and 25b are removed. A paint 27 is filled in the display part 6 as needed. When the display part 6 is formed by etching, it does not peel off easily.

According to this method, the slit 5, the display part 6, the through hole 7, the connecting part 8, and the hinge 9 may be formed at the same time by a single etching process. Therefore, this manufacturing method does not require more steps than the conventional method in which a single display part is formed by etching. Variations in the operating force of the movable parts 11 due to the difference in the width of the operating parts 3 may be made uniform by changing the width of the hinge 9, for example.

Although the present invention has been described with reference to a preferred embodiment thereof, the present invention is not limited to this. Various other changes and modifications may thus be made. For example, in the embodiment described above, a stainless steel plate was used as the metal plate of the operating part. However, a plate of other metals may alternatively be used. However, this metal plate is preferably made of an elastic material which has sufficient elastic recovering force. In place of the push switches 16, push switches of various other types may be used. The present invention is similarly applicable to the operating panel of other audio equipment and other electronic equipment and not limited to application for a tuner.

In summary, according to the present invention, the operating parts of a plurality of switches are integrally made of a single metal plate. Therefore, a number of switches may be arranged in a relatively small space, so that the equipment itself may be made compact in size. Since the operating parts are made of metal, the equipment will have excellent appearance. In this case, it is not necessary to plate the operating parts with metal as with a conventional operating panel made of synthetic resin. Since the respective operating parts may be formed in the etching step for forming the display part, manufacture is easy and the manufacturing cost may be reduced to a minimum. Furthermore, since it is possible to mount all the operating parts of the switches at the same time, mounting is easy. The display part is formed by etching, so that the display does not peel off easily.

Although various minor modifications may be suggested by those versed in the art, it should be understood that we wish to embody within the scope of the patent warranted hereon all such modifications as reasonably and properly come within the scope of our contribution to the art.

We claim as our invention:

1. A switch operating panel for electronic equipment comprising:
    a unitary metal plate adapted for mounting on a frame and divided into a plurality of juxtaposed switch operating parts by simultaneous etching from front and back surfaces thereof, said operating parts being separated from one another only by slits formed therebetween except for connecting parts remaining extending between said operating parts, said connecting parts formed as relatively reduced thickness on said metal plate by etching from the front surface of said metal plate,
    thin wall portion hinges respectively formed on said operating parts by etching from the back surface of said metal plate, each said hinge dividing said corresponding operating part into stationary and movable parts, said stationary parts being connected to each other by said connecting parts,
    display parts respectively formed only on said stationary parts by etching from the front surface of said metal plate, and
    projections respectively connected to back surfaces of said movable parts for engaging associated switch means interiorly mounted on said frame, and engaging parts respectively connected to the back surfaces of said movable parts at the free ends thereof for abutting against associated stop surfaces formed on said frame to maintain said movable parts normally flush with one another.

2. The switch operating panel of claim 1, wherein said operating parts are normally flush with one another.

3. The switch operating panel of claim 2, wherein said engaging parts are each of a L-shaped side profile.

4. The switch operating panel of claim 1, wherein said hinges each have a longitudinal axis parallel with a longitudinal axis of said metal plate.

5. The switch operating panel of claim 1, wherein said frame is mounted in an opening formed in an equipment front panel, said front panel being made of metal.

6. The switch operating panel of claim 1, wherein said metal plate is made of stainless steel.

7. The switch operating panel of claim 1, further comprising a through hole formed in at least one of said stationary parts by simultaneous etching from the front and back surfaces of said metal plate and a light-emitting element mounted in said frame in associated correspondence with said at least one through hole for displaying light therethrough, said light-emitting element being triggered by said associated switch means.

* * * * *